US012458979B2

(12) United States Patent
Kalashnikov

(10) Patent No.: US 12,458,979 B2
(45) Date of Patent: Nov. 4, 2025

(54) METHOD AND DEVICE FOR ELECTRIC PULSE FRAGMENTATION OF MATERIALS

(71) Applicant: Extiel EPF, LLC, Dallas, TX (US)

(72) Inventor: Yuri Kalashnikov, Dubai (AE)

(73) Assignee: Extiel AP, LLC, Dallas, TX (US)

( * ) Notice: Subject to any disclaimer, the term of this patent is extended or adjusted under 35 U.S.C. 154(b) by 335 days.

(21) Appl. No.: 18/108,938

(22) Filed: Feb. 13, 2023

(65) Prior Publication Data

US 2023/0256456 A1 Aug. 17, 2023

Related U.S. Application Data

(60) Provisional application No. 63/310,379, filed on Feb. 15, 2022.

(51) Int. Cl.
*B02C 19/18* (2006.01)
*H01T 14/00* (2006.01)
(Continued)

(52) U.S. Cl.
CPC .............. *B02C 19/18* (2013.01); *H02M 7/06* (2013.01); *H03K 17/567* (2013.01); *B02C 2019/183* (2013.01); *H01T 14/00* (2013.01)

(58) Field of Classification Search
CPC ........ B02C 19/18; B02C 19/183; H02M 7/06; H02M 3/335; H02M 5/458; H02M 1/007; H03K 17/567; H01T 14/00
See application file for complete search history.

(56) References Cited

U.S. PATENT DOCUMENTS 3,735,195 A * 5/1973 Jenkins ..................... C23F 3/04
                                                        315/363
10,029,262 B2    7/2018 Jeanneret et al.
(Continued)

FOREIGN PATENT DOCUMENTS

CN            100488637          5/2009
DE       102008033122 A1 *     1/2010    ........... C01B 33/037
WO      WO-2021173032 A1 *     9/2021    ............. B02C 19/18

OTHER PUBLICATIONS

English translate (WO2021173032A1), retrieved date Feb. 10, 2025.*

(Continued)

*Primary Examiner* — Mohammed S. Alawadi
(74) *Attorney, Agent, or Firm* — Brian K. Yost; Decker Jones, PC

(57) ABSTRACT

An electric pulse fragmentation device and method are provided, the device comprising a pulse transformer, one or more buffer capacitors, a plurality of IGBT modules, a storage capacitor, a spark gap, and a fragmentation chamber, the spark gap being defined by spark gap first and second electrodes, the fragmentation chamber comprising fragmentation chamber first and second electrodes. The buffer capacitors are electrically connected to a voltage rectifier. The buffer capacitors are charged by electrical current received from the voltage rectifier. The IGBT modules control partial discharge of the buffer capacitors to permit and restrict current flow from the buffer capacitor to transformer primary windings for a duration of a control pulse. The storage capacitor is charged by electrical current from transformer secondary windings. The storage capacitor is adapted to discharge current across the spark gap to the fragmentation chamber electrodes. Raw material positioned between fragmentation electrodes can be fractured.

21 Claims, 4 Drawing Sheets

(51) Int. Cl.
*H02M 1/00* (2007.01)
*H02M 3/335* (2006.01)
*H02M 5/458* (2006.01)
*H02M 7/06* (2006.01)
*H03K 17/567* (2006.01)

(56) References Cited

U.S. PATENT DOCUMENTS

| | | |
|---|---|---|
| 10,919,045 B2 | 2/2021 | Weh et al. |
| 2017/0096630 A1 | 4/2017 | Krishnaswamy et al. |
| 2018/0043368 A1 | 2/2018 | Müller-Siebert et al. |

OTHER PUBLICATIONS

English translate (DE102008033122A1), retrieved date Feb. 10, 2025.*
Shane, Thomas, International Search Report, Apr. 30, 2023, entire document, US.
Shane, Thomas, Written Opinion of the International Searching Authority, Jun. 2, 2023, US.

* cited by examiner

METHOD AND DEVICE FOR ELECTRIC PULSE FRAGMENTATION OF MATERIALS

This application claims the benefit of U.S. provisional patent application Ser. No. 63/310,379 filed Feb. 15, 2022, the contents of which are incorporated by reference herein in their entirety.

BACKGROUND OF THE INVENTION

1. Field of the Invention

The present invention relates generally to pulse fragmentation, and specifically to a method and device for electric pulse fragmentation of materials.

2. Description of the Prior Art

Silicon is a light chemical element with metallic and nonmetallic characteristics. It is an abundant element but is rarely found alone in nature. It is usually found in the form of silicon dioxide ($SiO_2$) in silicate minerals such as quartz. Silicon dioxide is also known as silica. Silica has a wide variety of industrial uses, including uses related to semiconductors, concrete, hydraulic fracturing, glass, food, cosmetics, and pharmaceuticals and, for example, to produce silicon ferroalloys and silicon metal. Silicon metal, in turn, can be processed into such products as ultra-high-purity semiconductors or solar panels.

Silicon can be obtained in a number of ways, including, for example, by purifying quartz. Quartz is purified by removing mineral impurities, particularly alkali metal impurities, from within the quartz crystal lattice structure. In an attempt to remove these impurities from quartz, a variety of techniques have been commonly employed. Such techniques include, for example, crushing, grinding, washing, and screening. Other methods include heavy liquid separations, froth flotations, and chemical treatment, and/or reaction techniques.

By way of further example, there are prior art devices and methods that rely upon creating an electric discharge on a solid intended to be fragmented. Two examples of such electric discharge devices and methods are an "electrohydraulic acting mode" and an "electrodynamic acting mode". In the electrohydraulic acting mode, the electrical path runs through a process liquid such that shock waves are produced within the process liquid which act upon the material. As this mode involves indirect action on the material, much of the electrical energy is not imparted to the material. At best, this process is inefficient. At worst, this process is ineffective with respect to hard materials. The force developed must overcome the relatively strong compressive strength of the material to achieve fragmentation. Additionally, the fractures resulting from this method generally do not follow the boundaries between the pure crystal and impurities associated with the crystal. This result makes separation of the two more difficult and expensive.

With the electrodynamic acting mode, the electrical path includes not only the process liquid, but also the material to be fragmented. Thus, a shock wave is generated within the material itself. This process is therefore more efficient than the electrohydraulic acting mode and can be used with harder materials, such as rock. For example, U.S. Pat. No. 10,919,045, Weh et al. provides a device for weakening pourable material such as slag from waste incineration. U.S. Pat. No. 10,029,262, Jeanneret et al. provides an electrodynamic acting device and method for fragmenting rock or ore.

Although these and other electrodynamic acting methods often provide better results than electrohydraulic methods, these devices rely upon conventional pulse generators which are ineffective at producing a shockwave of dimension and intensity capable of breaking down certain materials such as quartz along the impurity inclusion boundaries. To break down a piece of quartz of 100 mm in size, it is necessary to create an electric field intensity of more than 300 kV/cm and the duration of the current should be 30-70 nanoseconds. Prior art devices use almost century old technology in the form of Marx pulse generators which work by generating high-voltage pulses by charging a number of capacitors in parallel and then connecting them in series. These high-voltage pulse capacitors used in Marx generator circuits have an operating voltage of 40-100 kV and are made in the form of successive sections of lower-voltage capacitors. It is practically impossible to provide the necessary current duration when using Marx-type pulse generators. Due to the geometric dimensions of the Marx-type pulse capacitors themselves, conducting connections, and the distance from the generator to the process chamber, undesirably high inductance of the discharge circuit arises.

Moreover, because of uneven voltage distribution between the sections of the Marx generator during operation, one of the sections inevitably breaks through, which leads to the failure of the entire impulse capacitor. This, as well as the use of a large number of gas dischargers, leads to the failure of the Marx generators, increases the financial costs of their use in industrial applications and requires highly qualified personnel for their maintenance and repair.

It is therefore desirable to have a device and method that can be used to break down a piece of quartz of 100 mm in size and create an electric field intensity of more than 300 kV/cm such that the time for the voltage rise to the maximum value is in the first tens of nanoseconds.

It is desirable to have a device and method in which the energy consumption is significantly lower than conventional devices and methods.

It is desirable that the electrode system of such a device and method not be sensitive to changes in geometry so that the intervals between routine maintenance increase.

It is desirable that the electrodes in such a device be easy to manufacture and their replacement procedure be simple.

It is desirable that in using such a device and method, the fragmentation process be continuous so that the fragmentation chamber is able to continuously produce a desired size of crushed product and is provided a continuous supply of the raw materials.

It would be advantageous to be able to safely and economically produce an electrical pulse of sufficient voltage rise rate which can create an electric field intensity in excess of 300 kV/cm that can be directed to an interior of low purity crystal silicon ore or other raw material to exploit the relatively low tensile strength of the material and the natural boundaries between the crystal and impurities.

What is needed is a device and method that safely and economically produce a pulse of sufficient duration and electric field intensity so that silicon ore and other materials can be fragmented along distinct boundaries between desirable products and associated impurities.

SUMMARY OF THE INVENTION

The device and method of the present invention is adapted to safely and economically produce an electrical pulse of sufficient voltage rise rate which can create an electric field intensity in excess of 300 kV/cm that can be directed to an interior of low purity crystal silicon ore or other raw material to exploit the relatively low tensile strength of the material and the natural boundaries between the crystal and impurities.

With the present invention the discharge develops through solid matter, and destruction occurs due to tensile forces. The energy consumption is significantly lower than conventional devices and methods. The electrodes of the device of the present invention are easy to manufacture and simple to replace. The device is not sensitive to changes in geometry so that the intervals between routine maintenance increase.

The present invention permits continuous processing of material. The fragmentation chamber can be fed a continuous supply of the raw materials. The device can continuously produce a desired size of crushed product.

The electric pulse fragmentation (EPF) of raw materials takes place in a fragmentation chamber of the electric pulse fragmentation device (sometimes referred to herein as "EPF unit"). All other parts and accessories of the EPF unit are designed to provide the necessary parameters for supplying the required voltage and current pulses to the fragmentation chamber with a required frequency. The fragmentation chamber operates in a continuous mode and is adapted to fragment/crush hard raw material such as quartz ranging from approximately 5 to 100 mm in size.

The electric pulse fragmentation device of the preferred embodiment generally comprises a fragmentation chamber, a high-voltage discharge tube, a storage capacitor, and a high-voltage pulse transformer. The fragmentation chamber, the high-voltage discharge tube, and the storage capacitor are separated by respective upper, central, and lower diaphragms. The upper, central, and lower diaphragms of the preferred embodiment are made of dielectric material.

Fragmentation chamber body, fragmentation chamber cover, and the upper diaphragm, define the fragmentation chamber. The fragmentation chamber contains a frame grounded electrode and a central high voltage electrode. The frame grounded electrode is part of a frame that is grounded to earth.

The frame grounded electrode of preferred embodiments comprises a truncated cone configuration such that the frame grounded electrode comprises a narrow lower end and a wider upper end. The frame grounded electrode is positioned co-axially within the fragmentation chamber body and comprises an upward facing surface. Walls of the frame grounded electrode angle upward and outward at an angle, that in the preferred embodiment is preferably 50-70 degrees with respect to vertical.

A lower end of the central high voltage electrode is surrounded by a cylindrical polyurethane insert. The central high voltage electrode is located in a center portion of the fragmentation chamber and is secured in position by electrode holder. A preferred gap between the lower end of the central high voltage electrode and a narrow end of the cone of the frame grounded electrode is 20-25 mm. This arrangement permits breakdown of the fragmentation chamber discharge gap even with a fragmentation chamber empty of raw material, or with only a small-size raw material in the fragmentation chamber.

The central high-voltage electrode comprises a vertically elongated configuration and is positioned within the cone such that the upper end is approximately even with a horizontal middle of the cone. The central high voltage electrode and the frame grounded electrode of the preferred embodiment share a central longitudinal axis. A preferred distance from an upper end of the central high-voltage electrode to the surface of the cone is 50-80 mm. To increase the strength of the electric field at the upper end of the central high-voltage electrode, its upper end has a smaller diameter than the lower end.

Process demineralized water, with a specific conductivity of less than 5 microsiemens/cm (preferably less than 1 microsiemens/cm) enters through an opening in the fragmentation chamber cover.

Above the frame grounded electrode, is a replaceable conical control screen comprising a lattice with spacing between lattice members corresponding to a desired crushing size of the of raw material.

In the preferred embodiment, the liquid storage capacitor is used to store energy. The liquid storage capacitor comprises an internal voltage cylindrical electrode and an external grounded cylindrical electrode. The storage capacitor has a dielectric permeability of more than 20. The preferred dielectric liquid is glycerin, with a dielectric permeability of 40. Deionized water with a dielectric permeability of 81 can also be used.

On an outside surface of the external grounded cylindrical electrode, a cooling jacket is provided through which a cooling agent is pumped.

The storage capacitor is connected to the fragmentation chamber through the high-voltage gas discharge tube comprising a gas discharge tube spark gap. The high-voltage gas discharge tube comprises a discharge tube central electrode and a discharge tube negative electrode. The discharge tube negative electrode is positioned below the discharge tube central electrode. To ensure a stable breakdown voltage of the discharge tube spark gap, the respective discharge tube electrodes are toroidal, and a needle is installed on the discharge tube negative electrode.

The voltage across the storage capacitor during its charging from the high-voltage pulse transformer increases from zero to a maximum value. The high-voltage gas discharge tube of the preferred embodiment provides stable operation at a voltage close to a desired maximum. To reduce the time of deionization of the discharge tube spark gap and its cooling, moving gas is used through a closed circulation loop equipped with a fan, filter, and cooler.

The storage capacitor is connected to the high-voltage pulse transformer through a resistor acting as a filter, and the high-voltage pulse transformer is made as a rod-type transformer with a developed output capacitance. This capacitance is chosen less than that of the of the storage capacitor, and the energy losses associated with the presence of this capacitance are not significant. And the size of the resistor is chosen such that, with relatively long pulses of charging the storage capacitor, the resistor practically does not affect its charge, and when fast oscillating pulses appear, the resistor serves as a filter together with the output capacitance of the high-voltage pulse transformer.

The electric pulse fragmentation device of the preferred embodiment is arranged such that a three-phase mains voltage of 380-480 V is stepped-up through a step-up transformer to a voltage of 630-660 V, which provides galvanic isolation from the mains, and is fed through a three-phase rectifier to one or more buffer capacitors. The buffer capacitor is charged to an operating voltage of 920-1000 V.

In preferred embodiments, the primary windings of the high-voltage pulse transformer each consist of 1-5 turns of wire, 2 turns are preferred. There are many of these primary windings and they work in parallel. To ensure the charging of a storage capacity with an energy of 100-250 J for 10-20 microseconds at a voltage of 1000 V, a pulse current of 20-30 kA is required.

To ensure a large cross-section of the primary windings, 30-60 primary windings connected in parallel are used. In the preferred embodiment, there are 44 primary windings. Switching of such currents is successfully carried out by multiple insulated-gate bipolar transistor (IGBT) modules, one each connected to each of the multiple parallel primary windings. The secondary winding contains 400-800 turns of wire; thus, the transformation ratio of the transformer is 200-400. When the voltage across the buffer capacitors is 1000 V and operating in the partial discharge mode, the charging voltage of the storage capacitor doubles. Due to this, the charging of the storage capacitor up to the level of 400-500 kV is provided.

When a high-voltage pulse is formed on the secondary winding, the glycerol energy storage unit is charged up to a voltage of 450-500 kV; when the output spark gap is triggered, this voltage is applied to the electrodes of the technological chamber of the electric pulse crusher.

The IGBT modules are adapted to control the partial discharge of the buffer capacitors such that when the respective IGBT module is in an open configuration, current is permitted to flow from the respective buffer capacitors to the connected primary winding of the pulse transformer and when the respective IGBT module is in a closed configuration, current is prohibited from flowing from the respective buffer capacitors to the primary windings. Similarly, IGBT modules are adapted to move from the closed configuration to the open configuration for a duration of a control pulse received by each of the plurality of IGBT modules. In the preferred embodiment, the duration is 10-20 microseconds. The IGBT modules are adapted to move from the open configuration to the closed configuration upon cessation of the control pulse. Thus, the IGBT modules, open and close in a controlled manner. During the operating pulse, the voltage on the buffer capacitors does not drop to zero (as is the case with thyristors) but drops by 5-10% of its value.

In the preferred embodiment, the IGBT modules and the buffer capacitors of each primary winding are positioned directly on the housing of the high-voltage pulse transformer. This arrangement helps minimize inductive losses.

The high-voltage pulse transformer and filter resistor are filled with transformer oil.

Thus, the entire low voltage section is made on accessible industrial elements with a voltage class below 1000 V, and the high-voltage part is located inside the installation, inaccessible to the operator, and when the installation is turned off, the storage capacity self-discharge occurs due to its own conductivity, ensuring the industrial safety of the electric pulse installation.

The unit is assembled on a single frame, has small dimensions and weight. The installed capacity of one unit is 25 kW, and the capacity is more than 1 ton per hour in terms of input raw materials. The continuous mode of preferred embodiments continues for several hundred hours. Any required regular maintenance requires very little labor and generally involves only replacement of consumables or other easily replaceable components.

A method for electrical pulse fragmentation of materials is provided. The method may incorporate the elements described herein in various combinations. The method of a preferred embodiment comprises the steps of: providing a mains transformer, a pulse high-voltage transformer, a voltage rectifier one or more buffer capacitors, a plurality of IGBT modules, a storage capacitor, a spark gap, and a fragmentation chamber, the spark gap being defined by spark gap first and second electrodes, the fragmentation chamber comprising fragmentation chamber first and second electrodes; positioning raw material within the fragmentation chamber; using the voltage rectifier, converting alternating current input to direct current output; using the voltage rectifier, charging the one or more buffer capacitors; providing a control pulse to the plurality of IGBT modules, and using the plurality of IGBT modules, controlling a respective at least partial discharge of the one or more buffer capacitors such that when the respective IGBT module is in an open configuration, current is permitted to flow from the respective buffer capacitor to primary windings of the pulse transformer and when the respective IGBT module is in a closed configuration, prohibiting flow from the respective buffer capacitor to the primary windings of the pulse transformer; the plurality of IGBT modules each being adapted to move from the closed configuration to the open configuration for a duration of the control pulse; the plurality of IGBT modules each being further adapted to move from the open configuration to the closed configuration upon cessation of the control pulse; using the secondary windings, charging the storage capacitor with electrical current; upon the storage capacitor reaching a discharge voltage value, automatically discharging the storage capacitor across the spark gap to the fragmentation chamber first electrode and the fragmentation chamber second electrode, the fragmentation chamber first electrode and fragmentation chamber second electrode being separated by a space, a portion of the plurality of raw material being positioned within the space; and using the fragmentation chamber first electrode and the fragmentation chamber second electrode, fracturing a portion of the raw material.

In certain embodiments of the method, the duration of the control pulse is 10-20 microseconds. In certain embodiments of the method, the buffer capacitors are charged to a voltage between 920-1000 volts. In certain embodiments of the method, the storage capacitor discharge voltage value is 450,000-500,000 volts. In certain embodiments of the method, the buffer capacitors and the IGBT modules are positioned on a housing of the pulse transformer connected directly to a respective primary winding.

DESCRIPTION OF THE PREFERRED EMBODIMENT

Referring to FIGS. 1-4, there is shown an electric pulse fragmentation device 12 in accordance with preferred embodiments. As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment," "certain embodiments," "an embodiment," or similar term means that a particular feature, structure, or characteristic described in connection with the embodiment is included in at least one embodiment of the present disclosure. Thus, the appearances of such phrases in various places throughout this specification are not necessarily all referring to the same embodiment. Furthermore, the particular features, structures, or characteristics may be combined in any suitable manner on one or more embodiments without limitation. The detailed description illustrates by way of example, not by way of limitation, the principles of the invention. This description will clearly enable one skilled in the art to make and use the invention, and describes several embodiments, adaptations, variations, alternatives, and uses of the invention, including what is presently believed to be the best mode of carrying out the invention.

Figure 1:
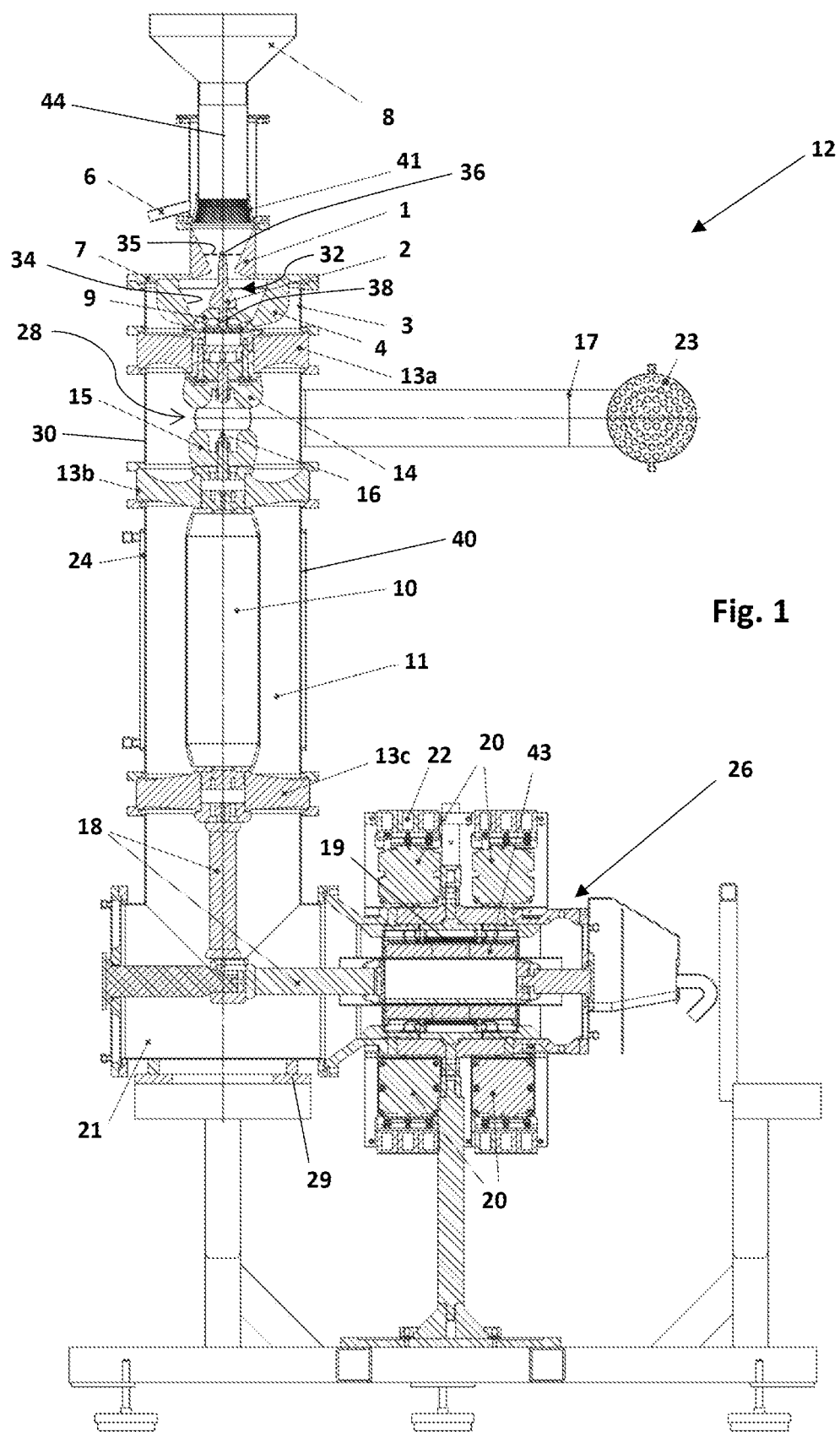
FIG. 1 is a partial sectional elevation view of the electric pulse fragmentation device of the present invention, in accordance with a preferred embodiment.
Figure 2:
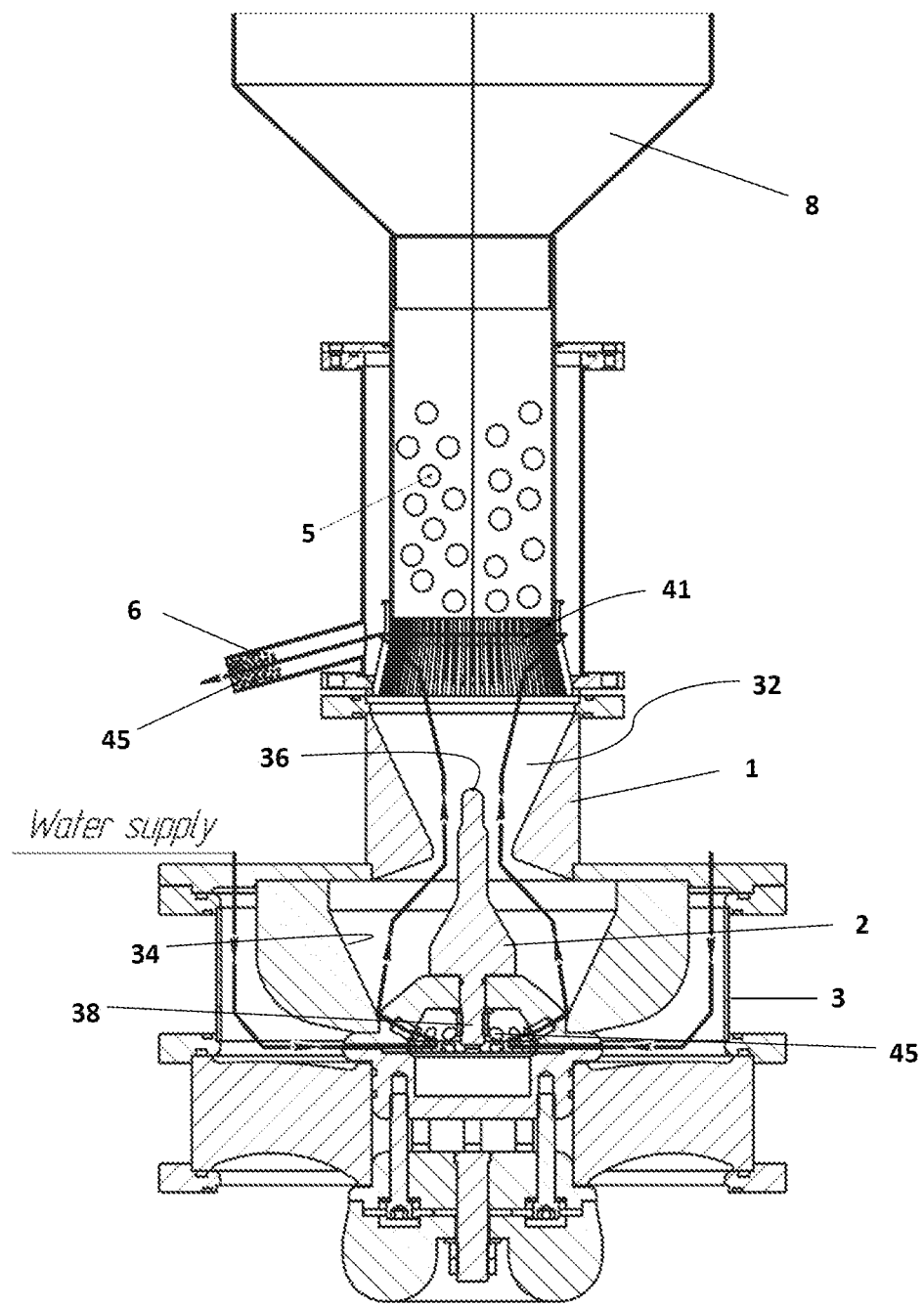
FIG. 2 is an enlarged view of the fragmentation chamber portion of the electric pulse fragmentation device of FIG. 1 showing the water supply and flow of material.
Figure 3:
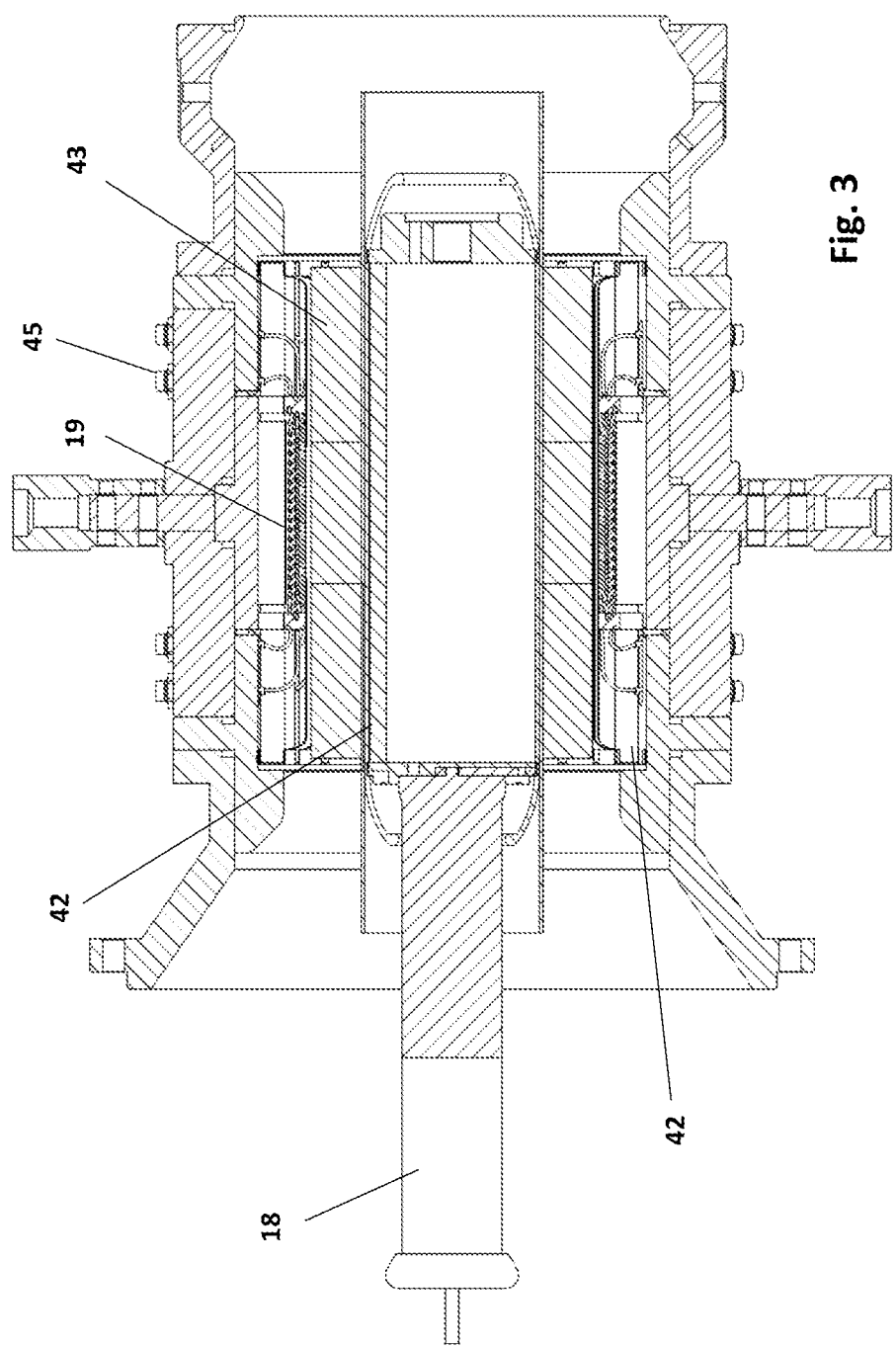
FIG. 3 is a sectional view of a portion of the high voltage pulse transformer of FIG. 1.

Referring to FIGS. 1 and 2, the provided processes of electric pulse fragmentation (EPF) of raw materials 5 (FIG. 2) takes place in a fragmentation chamber 32 of the electric pulse fragmentation device 12 (sometimes referred to herein as "EPF unit" 12). All other parts and accessories of the EPF unit 12 are designed to provide the necessary parameters for supplying the required voltage and current pulses to the fragmentation chamber 32 with a required frequency. The fragmentation chamber 32 operates in a continuous mode and is adapted to fragment/crush hard raw material 5 such as quartz ranging from approximately 5 to 100 mm in size.

The electric pulse fragmentation device 12 of the preferred embodiment generally comprises a fragmentation chamber 32, a high-voltage discharge tube 30, a storage capacitor 24, and a high-voltage pulse transformer 26. The fragmentation chamber 32, the high-voltage discharge tube 30, and the storage capacitor 24 are separated by respective upper, central, and lower diaphragms 13a, 13b, and 13c. The upper, central, and lower diaphragms 13a, 13b, and 13c of the preferred embodiment are made of dielectric material.

Fragmentation chamber body 3, fragmentation chamber cover 7, and the upper diaphragm 13a, define the fragmentation chamber 32. The fragmentation chamber 32 contains a frame grounded electrode 1 and a central high voltage electrode 2. The frame grounded electrode 1 is part of a frame 29 that is grounded to earth.

The frame grounded electrode 1 of preferred embodiments comprises a truncated cone configuration such that the frame grounded electrode 1 comprises a narrow lower end and a wider upper end. The frame grounded electrode 1 is positioned co-axially within the fragmentation chamber body 3 and comprises an upward facing surface 34. Walls of the frame grounded electrode 1 angle upward and outward at an angle, that in the preferred embodiment is preferably 50-70 degrees with respect to vertical.

A lower end 38 of the central high voltage electrode 2 is surrounded by a cylindrical polyurethane insert 4. The central high voltage electrode 2 is located in a center portion of the fragmentation chamber 32 and is secured in position by electrode holder 9. A preferred minimum gap between the lower end 38 of the central high voltage electrode 2 and a narrow end of the cone 34 of the frame grounded electrode 1 is 20-25 mm. This arrangement permits breakdown of the fragmentation chamber 32 discharge gap even with a fragmentation chamber 32 empty of raw material 5, or with only a small-size raw material 5 in the fragmentation chamber 32.

The central high-voltage electrode 2 comprises a vertically elongated configuration and is positioned within the cone 34 such that the upper end 36 is approximately even with a horizontal middle of the cone 35, (the horizontal middle of the cone 35 represented by dashed line of FIG. 1). The central high voltage electrode 2 and the frame grounded electrode 1 of the preferred embodiment share a central longitudinal axis (such central longitudinal axis represented by line 44 of FIG. 1). A preferred minimum distance from an upper end 36 of the central high-voltage electrode 2 to the surface of the cone 34 is 50-80 mm. To increase the strength of the electric field at the upper end 36 of the central high-voltage electrode 2, its upper end 36 has a smaller diameter than the lower end 38. When a large piece of raw material 5 enters the fragmentation chamber 32, it inevitably touches simultaneously both the frame grounded electrode 1 and the central high-voltage electrode 2. When a high voltage is applied to the central high-voltage electrode 2, an electric field arises over the entire surface of the central high-voltage electrode 2, however, the breakdown delay with a large piece of raw material 5 lying against the upper end 36 turns out to be less than with smaller pieces of raw material 5 in the middle part 35, and the breakdown occurs through a large piece of raw material 5, fracturing it with high efficiency. With this geometry of the central high-voltage electrode 2, it becomes insensitive to changes in its dimensions due to electrical erosion. With a decrease in the diameter of the upper end 36 of the central high-voltage electrode 2, the field strength only increases, and with a larger middle part 35, an increase in the fragmentation chamber 32 process gap beyond 25 mm occurs only after an extended period of time elapses. This construction advantageously permits the electric pulse fragmentation device 12 to be continuously operated for several hundred hours before scheduled maintenance is required.

Process demineralized water, with a specific conductivity of less than 5 microsiemens/cm (preferably less than 1 microsiemens/cm) enters through an opening in the fragmentation chamber cover 7. Further, through a space between the fragmentation chamber body 3 and the cylindrical polyurethane insert 4, the demineralized water enters a lower part of electrode holder 9 in which holes are made for the passage of water into an area in which the central high-voltage electrode 2 is positioned. Thus, the water rises in the fragmentation chamber 32 from the bottom up. The inner space formed by the central high-voltage electrode 2 and the inner surface of the cylindrical polyurethane liner is filled with relatively fine crushed material 45 that acts as an additional insulator. Thus, the lower end 38 of the central high-voltage electrode 2 has multilayer insulation from fragmentation chamber body 3 in the form of a mixture of water and fine crushed material 45, the cylindrical polyurethane insert 4, and clean incoming demineralized water.

The maximum field strength is in an upper part of the fragmentation chamber 32. Therefore, electrical breakdowns occur primarily in this area. Moreover, despite large gaps adjacent to the upper end 36 of the central high-voltage electrode 2, in the presence of a large piece of raw material 45 there, the electrical breakdown occurs preferably there.

Above the frame grounded electrode 1, is a replaceable conical control screen 41 comprising a lattice with spacing between lattice members corresponding to a desired crushing size of the of raw material 5. This control screen 41 can be easily changed to a similar screen with other lattice spacing to permit, for example, larger particles to exit the device 12. Particles of crushed raw material 45 together with fluid flowing out of the fragmentation chamber 32 leave the electric pulse fragmentation device 12 through outlet 6. The input raw material 5 continuously enters the installation through inlet pipe 8.

In the preferred embodiment, there is little to no free flow of fluid in the fragmentation chamber 32. In other embodiments, there is free flow of fluid in the fragmentation chamber 32. In the preferred embodiment, there is a pulsating flow of fluid within the fragmentation chamber 32 as well as fluid flow resulting from shock waves. The pulsations and shock waves assist crushed raw material 45 to rise within the fragmentation chamber 32 and, if smaller than a predetermined size, pass through the control screen 41 to the outlet 6. Crushing occurs first in large pieces of raw material 5 due to the discharge through the body of a portion of the raw material 5, and in small pieces of raw material 5 due to the impact of a shock wave, the duration of which is determined by the duration of the electric current pulse.

Referring to FIG. 1, in the preferred embodiment, the liquid storage capacitor 24 is used to store energy. The liquid storage capacitor 24 comprises an internal voltage cylindrical electrode 10 and an external grounded cylindrical electrode 11. The storage capacitor 24 has a dielectric permeability of more than 20. The preferred dielectric liquid is glycerin, with a dielectric permeability of 40. Deionized water with a dielectric permeability of 81 can also be used.

To lower the specific conductivity of the liquid dielectric, additional cooling of an external surface of the storage capacitor 24 to a temperature of preferably between 2-5° C. is used. On an outside surface of the external grounded cylindrical electrode 11, a cooling jacket 40 is provided through which a cooling agent is pumped.

Embodiments that use deionized water for the liquid dielectric continuously pump high resistance water through the storage capacitor 24 by auxiliary pump (not shown). This water then enters the fragmentation chamber 32, mixing with the main process water.

Since the liquid dielectric has a relatively high conductivity, it can hold the operating voltage for a fairly short time. Therefore, pulsed charging of the storage capacitor 24 is used. Such pulsed charging of the storage capacitor 24 is provided by the pulse high-voltage transformer 26. In the preferred embodiment, the storage capacitor 24 is charged in 50 microseconds or less and preferably 10-20 microseconds.

The storage capacitor 24 is connected to the fragmentation chamber 32 through the high-voltage gas discharge tube 30 comprising a gas discharge tube spark gap 28. The high-voltage gas discharge tube 30 comprises a discharge tube central electrode 14 and a discharge tube negative electrode 15. The discharge tube negative electrode 15 is positioned below the discharge tube central electrode 14. To ensure a stable breakdown voltage of the discharge tube 30 spark gap, the respective discharge tube 30 electrodes 14, 15 are toroidal, and a needle 16 is installed on the discharge tube negative electrode 15. The needle 16 of the discharge tube negative electrode 15 is located in the plane of the discharge tube central electrode 14. Because the high-voltage pulse transformer 26 generates a working pulse of negative polarity, the needle 16 is installed on, and electrically connected to, the discharge tube negative electrode 15.

The voltage across the storage capacitor 24 during its charging from the high-voltage pulse transformer 26 increases from zero to a maximum value. When the gas ionization voltage is reached at an upper tip of the needle 16, an incomplete electrical breakdown occurs, characterized by the presence of UV radiation and the appearance of gas conduction ions and free electrons where the discharge tube spark gap 28 is pre-ionized and the breakdown voltage is stabilized eliminating any changes in the breakdown voltage of the spark gap 28. As the discharge energy depends on the square of the voltage across the storage capacitor 24, changes in the breakdown voltage of the discharge tube spark gap 28 is undesirable. The high-voltage gas discharge tube 30 of the preferred embodiment provides stable operation at a voltage close to a desired maximum. To reduce the time of deionization of the discharge tube spark gap 28 and its cooling, moving gas is used through a closed circulation loop 17 equipped with a fan, filter, and cooler 23. The working gas pressure in the high-voltage gas discharge tube 30 of the preferred embodiment is set at 2-5 bar. Both nitrogen and compressed air are used. The presence of oxygen as an electronegative gas stabilizes the operation of the discharge tube spark gap 28. Part of the gas is vented to the atmosphere, and these losses are compensated for by the addition of compressed gases. This arrangement allows the high-voltage gas discharge tube 30 to have a switching frequency of up to 100 Hz.

When the gas discharge tube spark gap 28 is triggered, the storage capacitor 24 generates powerful current and voltage pulses, including reverse polarity, with times of tens of nanoseconds. In fact, the storage capacitor 24 itself becomes a powerful pulse generator. These pulses, if applied to the secondary winding 43 of the high-voltage pulse transformer 26, can disable it due to the breakdown of the turn-to-turn insulation of the winding. To avoid this, the storage capacitor 24 is connected to the high-voltage pulse transformer 26 through a resistor 18 acting as a filter, and the high-voltage pulse transformer 26 is made as a rod-type transformer with a developed output capacitance. This capacitance is chosen less than that of the of the storage capacitor 24, and the energy losses associated with the presence of this capacitance are not significant. And the size of the resistor 18 is chosen such that, with relatively long pulses of charging the storage capacitor 24, the resistor 18 practically does not affect its charge, and when fast oscillating pulses appear, the resistor 18 serves as a filter together with the output capacitance of the high-voltage pulse transformer 26. In preferred embodiments, this resistor 18 is chosen in the value of 300-700 Ohm. In such embodiments, the time constant formed by the value of this resistor 18 and the storage capacitance is 0.5-2 microseconds, which is an order of magnitude shorter than the charging time of the storage capacitor 24 and more than an order of magnitude longer than the voltage oscillation time across the storage capacitance.

Figure 4:
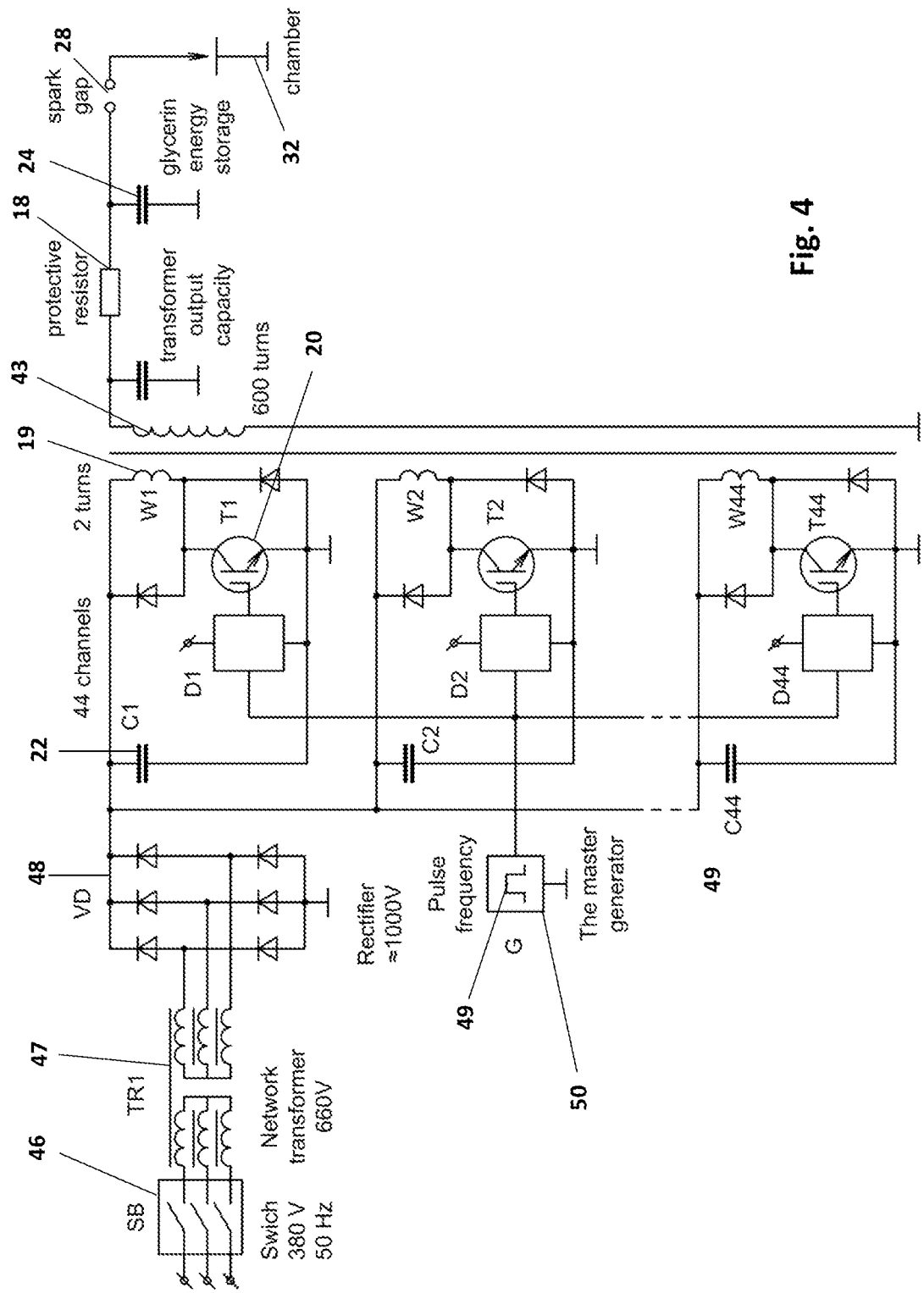
FIG. 4 is an electric diagram of the electric pulse fragmentation device of FIG. 1.

Referring to FIG. 4, the electric pulse fragmentation device 12 of the preferred embodiment is arranged such that a three-phase mains 46 voltage of 380-480 V is stepped-up through a step-up transformer 47 to a voltage of 630-660 V, which provides galvanic isolation from the mains 46, and is fed through a three-phase rectifier 48 to one or more buffer capacitors 22. Each of the one or more buffer capacitors 22 is charged to an operating voltage of 920-1000 V. The buffer capacitors 22 of the preferred embodiment operate in partial discharge mode and their capacitance value is chosen an order of magnitude greater than the reduced capacity of the storage capacitor 24 to the primary side of the high-voltage pulse transformer 26. Due to this, these capacitors 22 practically do not fail.

In preferred embodiments, the primary windings 19 of the high-voltage pulse transformer 26 each consist of 1-5 turns of wire, 2 turns are preferred. There are many of these primary windings 19 and they work in parallel. To ensure the charging of a storage capacity with an energy of 100-250 J for 10-20 microseconds at a voltage of 1000 V, a pulse current of 20-30 kA is required.

To ensure a large cross-section of the primary windings 19, 30-60 primary windings 19 connected in parallel are used. Referring to FIG. 4, in the preferred embodiment, there are 44 primary windings 19 connected to winding end connectors 45. This arrangement reduces the magnitude of the impulse current in each primary winding 19 to 600-800 Amperes. Switching of such currents is successfully carried out by multiple insulated-gate bipolar transistor (IGBT) modules 20 each connected to one of the multiple parallel primary windings. The secondary winding 43 contains 400-800 turns of wire, thus the transformation ratio of the transformer 26 is 200-400. When the voltage across the buffer capacitors 22 is 1000 V and operating in the partial discharge mode, the charging voltage of the storage capacitor 24 doubles. Due to this, the charging of the storage capacitor 24 up to the level of 400-500 kV is provided. In preferred embodiments, the pulse transformer comprises silicon-sheet rod 42 material, for example, and electrical steel material formed from an iron alloy having silicon content.

Structurally, the secondary winding 43 is wound on a central core magnetic circuit which performs the function of the output capacitance of the high-voltage pulse transformer 26. The value of this capacity is chosen equal to approximately 10% of the value of the main storage device on a liquid dielectric made of glycerin. Further, the output of the high-voltage pulse transformer is connected through a protective resistor to the glycerin energy storage device. When a high-voltage pulse is formed on the secondary winding, the glycerol energy storage unit is charged up to a voltage of 450-500 kV; when the output spark gap is triggered, this voltage is applied to the electrodes of the technological chamber of the electric pulse crusher.

Since the inductance of the discharge circuit is low, the half-wave of the discharge current is from 40 to 70 nanoseconds, while the polarity can be reversed on the glycerol storage. If you do not take special measures, then these voltage surges are applied directly to the output winding of the pulse transformer and can damage it due to breakdown of the interturn insulation. It is for this reason that a protective resistor is installed, which, together with the output capacitance of the high-voltage transformer, forms a high-frequency filter and the specified high-frequency oscillation voltage is applied to the protective resistor, and not to the turns of the high-voltage transformer.

The IGBT modules 20 are adapted to control the partial discharge of the buffer capacitors 22 such that when the respective IGBT module 20 is in an open configuration, current is permitted to flow from the respective buffer capacitors 22 to the primary windings 19 of the pulse transformer 26 and when the respective IGBT module 20 is in a closed configuration, current is prohibited from flowing from the respective buffer capacitors 22 to the primary windings 19. Similarly, IGBT modules 20 are adapted to move from the closed configuration to the open configuration for a duration of a control pulse 49 received by each of the plurality of IGBT modules 20. In the preferred embodiment, the duration is 10-20 microseconds. In the preferred embodiment, the control pulse 49 is generated by a master generator 50.

The IGBT modules 20 are adapted to move from the open configuration to the closed configuration upon cessation of the control pulse. Thus, the IGBT modules 20, open and close in a controlled manner. During the operating pulse, the voltage on the buffer capacitors 22 does not drop to zero (as is the case with thyristors) but drops by 5-10% of its value.

In the preferred embodiment, the IGBT modules 20 and the buffer capacitors 22 are positioned directly on the housing of the high-voltage pulse transformer 26. This arrangement helps minimize inductive losses.

The high-voltage pulse transformer 26 and filter resistor 18 are filled with transformer oil 21.

Of course, the duration of a circuit discharge current is determined as the square root of the product of the discharge capacity and the inductance of the circuit. The higher the operating voltage of the generator, the lower the capacitance of the capacitor with the same energy reserve.

In preferred embodiments, the fragmentation chamber 32 is connected directly to the storage capacitor 24 through only one switching spark gap 28 and the conventional Marx pattern is not used. The storage capacitor 24 is charged to a level of 400-500 kV, resulting in a power reserve of 150-300 J and a capacitance value of 1000-3000 picofarads. In these embodiments, the inductance of the discharge circuit is only 120-250 nanohenry (nH). As a result, a half-wave duration of the current is 30-70 nanoseconds.

Thus, the entire low voltage section is made on accessible industrial elements with a voltage class below 1000 V, and the high-voltage part is located inside the installation, inaccessible to the operator, and when the installation is turned off, the storage capacity self-discharge occurs due to its own conductivity, ensuring the industrial safety of the electric pulse installation.

The unit is assembled on a single frame, has small dimensions and weight. The installed capacity of one unit is 25 kW, and the capacity is more than 1 ton per hour in terms of input raw materials. The continuous mode of preferred embodiments continues for several hundred hours. Any required regular maintenance requires very little labor and generally involves only replacement of consumables or other easily replaceable components.

A method for electrical pulse fragmentation of materials is provided. The method may incorporate the elements described herein in various combinations. The method of a preferred embodiment comprises the steps of: providing a pulse transformer 26, a voltage rectifier 48, one or more buffer capacitors 22, a plurality of IGBT modules 20, a storage capacitor 24, a spark gap 28, and a fragmentation chamber 32, the spark gap 28 being defined by spark gap first and second electrodes 15, 14, the fragmentation chamber 32 comprising fragmentation chamber first and second electrodes 2, 1; positioning raw material 5 within the fragmentation chamber 32; using the voltage rectifier 48, converting alternating current input to direct current output; using the voltage rectifier 48, charging the one or more buffer capacitors 22; providing a control pulse 49 to the plurality of IGBT modules 20, controlling a respective at least partial discharge of the one or more buffer capacitors 22 such that when the respective IGBT module 20 is in an open configuration, current is permitted to flow from the respective buffer capacitor 22 to primary windings 19 of the pulse transformer 26 and when the respective IGBT module 20 is in a closed configuration, prohibiting flow from the respective buffer capacitor 22 to the primary windings 19 of the pulse transformer; the plurality of IGBT modules 20 each being adapted to move from the closed configuration to the open configuration for a duration of the control pulse 49; the plurality of IGBT modules 20 each being further adapted to move from the open configuration to the closed configuration upon cessation of the control pulse 49; using the secondary windings 43, charging the storage capacitor 24 with electrical current; upon the storage capacitor 24 reaching a discharge voltage value, automatically discharging the storage capacitor 24 across the spark gap 28 to the fragmentation chamber first electrode 2 and the fragmentation chamber second electrode 1, the fragmentation chamber first electrode 2 and fragmentation chamber second electrode 1 being separated by a space, a portion of the plurality of raw material 5 being positioned within the space; and using the fragmentation chamber first electrode 2 and the fragmentation chamber second electrode 1, fracturing a portion of the raw material 5.

In certain embodiments of the method, the duration of the control pulse 49 is 10-20 microseconds. In certain embodiments of the method, the buffer capacitors 22 are charged to a voltage between 920-1000 volts. In certain embodiments of the method, the storage capacitor 24 discharge voltage value is 450,000-500,000 volts. In certain embodiments of the method, the buffer capacitors 22 and the IGBT modules 20 are positioned on a housing of the pulse transformer 26.

While there has been illustrated and described what is, at present, considered to be a preferred embodiment of the present invention, it will be understood by those skilled in the art that various changes and modifications may be made, and equivalents may be substituted for elements thereof without departing from the true scope of the invention. Therefore, it is intended that this invention not be limited to the particular embodiment disclosed as the best mode contemplated for carrying out the invention, but that the invention will include all embodiments falling within the scope of this disclosure.

The invention claimed is:

1. An electric pulse fragmentation device comprising:

A step up transformer, a high-voltage pulse transformer, a voltage rectifier, one or more buffer capacitors, a plurality of insulated-gate bipolar transistor (IGBT) modules, a storage capacitor, a spark gap, and a fragmentation chamber, the spark gap being defined by a spark gap first electrode and a spark gap second electrode, the fragmentation chamber comprising a fragmentation chamber first electrode and a fragmentation chamber second electrode;

the one or more buffer capacitors being electrically connected to the voltage rectifier, the voltage rectifier being adapted to convert alternating current input received from the step up transformer to direct current output, the one or more buffer capacitors being structured and arranged to be charged by electrical current received from the voltage rectifier;

the pulse transformer comprising primary and secondary windings structured and arranged to transform an input voltage to an output voltage, the output voltage being greater than the input voltage;

each of the plurality of IGBT modules being adapted to control a respective at least partial discharge of the one or more buffer capacitors such that when a respective IGBT module of the plurality of IGBT modules is in an open configuration, current is permitted to flow from a respective buffer capacitor of the one or more buffer capacitors to the primary windings of the pulse transformer and when the respective IGBT module is in a closed configuration, current is prohibited from flowing from the respective buffer capacitor to the primary windings of the pulse transformer;

each of the plurality of IGBT modules being further adapted to move from the closed configuration to the open configuration for a duration of a control pulse received by each of the plurality of IGBT modules;

each of the plurality of IGBT modules being further adapted to move from the open configuration to the closed configuration upon cessation of the control pulse;

the storage capacitor being adapted to be charged by electrical current from the secondary windings of the pulse transformer;

the storage capacitor being further adapted to discharge current across the spark gap to the spark gap second electrode upon the spark gap first electrode reaching a discharge voltage value;

the spark gap second electrode being electrically connected to the fragmentation chamber first electrode;

the fragmentation chamber being adapted to receive raw material such that portions of the raw material are positioned between the fragmentation chamber first electrode and the fragmentation chamber second electrode;

the fragmentation chamber first electrode and the fragmentation chamber second electrode being structured and arranged to cause a fracture in portions of the raw material upon discharge of the storage capacitor.

2. The electric pulse fragmentation device of claim 1, wherein the duration of the control pulse is 10-20 microseconds.

3. The electric pulse fragmentation device of claim 1, the device further comprising one or more resistors electrically connected to and positioned between the secondary windings and the storage capacitor.

4. The electric pulse fragmentation device of claim 1, the device further comprising a discharge tube, the spark gap being positioned within the discharge tube.

5. The electric pulse fragmentation device of claim 4, the discharge tube being supplied with pressurized gases.

6. The electric pulse fragmentation device of claim 1, the fragmentation chamber comprising walls, the walls defining a truncated conical configuration.

7. The electric pulse fragmentation device of claim 6, an upper portion of the fragmentation chamber first electrode extending upward between the walls.

8. The electric pulse fragmentation device of claim 7, the fragmentation chamber second electrode being a grounded part of a frame housing.

9. The electric pulse fragmentation device of claim 1, the one or more buffer capacitors being charged to a voltage between 920-1000 volts.

10. The electric pulse fragmentation device of claim 9 the storage capacitor discharge voltage value being 450,000-500,000 volts.

11. The electric pulse fragmentation device of claim 1, the one or more buffer capacitors and the plurality of IGBT modules being positioned on a housing of the pulse transformer.

12. An electric pulse fragmentation device comprising:

a pulse transformer, one or more buffer capacitors, one or more resistors; a plurality of insulated-gate bipolar transistor (IGBT) modules, a storage capacitor, a spark gap, and a fragmentation chamber;

the buffer capacitors and the IGBT modules being positioned on a housing of the pulse transformer;

the spark gap being defined by a spark gap first electrode and a spark gap second electrode and being positioned within a discharge tube, the discharge tube being supplied with one or more pressurized gases;

the fragmentation chamber comprising fragmentation chamber first and second electrodes;

the one or more buffer capacitors being electrically connected to a voltage rectifier adapted to convert alternating current input to direct current output, the one or more buffer capacitors being structured and arranged to be charged to a first voltage value by electrical current received from the voltage rectifier;

the pulse transformer comprising primary and secondary windings structured and arranged to transform an input voltage to an output voltage, the output voltage being greater than the input voltage;

the one or more resistors being electrically connected to and positioned between the secondary windings and the storage capacitor each of the plurality of IGBT modules being adapted to control a respective at least partial discharge of the one or more buffer capacitors such that when a respective IGBT module of the plurality of IGBT modules is in an open configuration, current is permitted to flow from the respective buffer capacitor to the primary windings of the pulse transformer and when the respective IGBT module is in a closed configuration, current is prohibited from flowing from a respective buffer capacitor of the one or more buffer capacitors to the primary windings of the pulse transformer;

each of the plurality of IGBT modules being further adapted to move from the closed configuration to the open configuration for a duration of a control pulse received by each of the plurality of IGBT modules;

each of the plurality of IGBT modules being further adapted to move from the open configuration to the closed configuration upon cessation of the control pulse;

the storage capacitor being adapted to be charged by electrical current from the secondary windings of the pulse transformer;

the storage capacitor being further adapted to discharge current across the spark gap to the spark gap second electrode upon the spark gap first electrode reaching a second voltage value, the second voltage value being a discharge voltage value;

the spark gap second electrode being electrically connected to the fragmentation chamber first electrode;

the fragmentation chamber being adapted to receive raw material such that portions of the raw material are positioned between the fragmentation chamber first electrode and the fragmentation chamber second electrode;

the fragmentation chamber first electrode and the fragmentation chamber second electrode being structured and arranged to cause a fracture in portions of the raw material upon discharge of the storage capacitor.

13. The electric pulse fragmentation device of claim 12, wherein:
the first voltage value is 920-1000 volts;
the discharge voltage value is 450.000-500.000 volts;
the duration of the control pulse is 10-20 microseconds.

14. The electric pulse fragmentation device of claim 12, the fragmentation chamber comprising walls, the walls defining a truncated conical configuration.

15. The electric pulse fragmentation device of claim 14, an upper portion of the fragmentation chamber first electrode extending upward between the walls.

16. The electric pulse fragmentation device of claim 15, the fragmentation chamber second electrode being a grounded part of a frame housing.

17. A method for electrical pulse fragmentation of materials, the method comprising the steps of:

providing a voltage rectifier, a pulse transformer, one or more buffer capacitors, a plurality of insulated-gate bipolar transistor (IGBT) modules, a storage capacitor, a spark gap, and a fragmentation chamber, the spark gap being defined by a spark gap first electrode and a spark gap second electrode, the fragmentation chamber comprising a fragmentation chamber first electrode and a fragmentation chamber second electrode;

positioning raw material within the fragmentation chamber;

using the voltage rectifier, converting alternating current input to direct current output;

using the voltage rectifier, charging the one or more buffer capacitors;

providing a control pulse to the plurality of IGBT modules, and, using the plurality of IGBT modules, controlling a respective at least partial discharge of the one or more buffer capacitors such that when a respective IGBT module of the plurality of IGBT modules is in an open configuration, current is permitted to flow from the respective buffer capacitor to primary windings of the pulse transformer and when the respective IGBT module is in a closed configuration, prohibiting flow from a respective buffer capacitor of the one or more buffer capacitors to the primary windings of the pulse transformer;

each of the plurality of IGBT modules being adapted to move from the closed configuration to the open configuration for a duration of the control pulse;

each of the plurality of IGBT modules being further adapted to move from the open configuration to the closed configuration upon cessation of the control pulse;

using the secondary windings, charging the storage capacitor with electrical current;

upon the storage capacitor reaching a discharge voltage value, automatically discharging the storage capacitor across the spark gap to the fragmentation chamber first electrode and the fragmentation chamber second electrode, the fragmentation chamber first electrode and fragmentation chamber second electrode being separated by a space, a portion of the raw material being positioned within the space;

using the fragmentation chamber first electrode and the fragmentation chamber second electrode, fracturing a portion of the raw material.

18. The method of claim 17, wherein the duration of the control pulse is 10-20 microseconds.

19. The method of claim 17, wherein the one or more buffer capacitors are charged to a voltage between 920-1000 volts.

20. The method of claim 17, wherein the storage capacitor discharge voltage value is 450,000-500,000 volts.

21. The method of claim 17, the one or more buffer capacitors and the plurality of IGBT modules being positioned on a housing of the pulse transformer.

* * * * *